(12) United States Patent
Tran et al.

(10) Patent No.: US 9,075,744 B2
(45) Date of Patent: Jul. 7, 2015

(54) PERFORMANCE AND POWER IMPROVEMENT ON DMA WRITES TO LEVEL TWO COMBINED CACHE/SRAM THAT IS CAUSED IN LEVEL ONE DATA CACHE AND LINE IS VALID AND DIRTY

(75) Inventors: Jonathan (Son) Hung Tran, Murphy, TX (US); Raguram Damodaran, Plano, TX (US); Abhijeet Ashok Chachad, Plano, TX (US); Joseph Raymond Michael Zbiciak, Arlington, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 798 days.

(21) Appl. No.: 13/245,183

(22) Filed: Sep. 26, 2011

(65) Prior Publication Data

US 2012/0191914 A1 Jul. 26, 2012

Related U.S. Application Data

(60) Provisional application No. 61/387,283, filed on Sep. 28, 2010.

(51) Int. Cl.
| | | |
|---|---|---|
| G06F 12/08 | (2006.01) | |
| G06F 11/10 | (2006.01) | |
| G06F 7/483 | (2006.01) | |
| G06F 9/30 | (2006.01) | |
| H03M 13/35 | (2006.01) | |
| H03M 13/29 | (2006.01) | |
| H03K 19/00 | (2006.01) | |
| G06F 1/32 | (2006.01) | |
| H03K 21/00 | (2006.01) | |
| G06F 12/02 | (2006.01) | |

(52) U.S. Cl.
CPC .......... *G06F 11/1064* (2013.01); *G06F 7/483* (2013.01); *G06F 9/3012* (2013.01); *H03M 13/353* (2013.01); *H03M 13/2903* (2013.01); *H03K 19/0016* (2013.01); *G06F 1/3296* (2013.01); *H03K 21/00* (2013.01); *G06F 12/0246* (2013.01); *Y02B 60/32* (2013.01); *Y02B 60/1214* (2013.01); *Y02B 60/1285* (2013.01)

(58) Field of Classification Search
None
See application file for complete search history.

(56) References Cited

U.S. PATENT DOCUMENTS

| | | | | |
|---|---|---|---|---|
| 4,646,233 A | * | 2/1987 | Weatherford et al. | 711/3 |
| 5,113,514 A | * | 5/1992 | Albonesi et al. | 711/144 |
| 5,319,766 A | * | 6/1994 | Thaller et al. | 711/146 |
| 5,537,575 A | * | 7/1996 | Foley et al. | 711/141 |
| 5,553,266 A | * | 9/1996 | Metzger et al. | 711/144 |
| 5,706,463 A | * | 1/1998 | Ebrahim et al. | 711/120 |
| 5,765,196 A | * | 6/1998 | Liencres et al. | 711/143 |
| 5,875,462 A | * | 2/1999 | Bauman et al. | 711/119 |
| 5,987,544 A | * | 11/1999 | Bannon et al. | 710/100 |
| 6,018,763 A | * | 1/2000 | Hughes et al. | 709/213 |

(Continued)

*Primary Examiner* — Cheng-Yuan Tseng
*Assistant Examiner* — Ramon A Mercado
(74) *Attorney, Agent, or Firm* — Robert D. Marshall, Jr.; Frank D. Cimino

(57) ABSTRACT

This invention optimizes DMA writes to directly addressable level two memory that is cached in level one and the line is valid and dirty. When the level two controller detects that a line is valid and dirty in level one, the level two memory need not update its copy of the data. Level one memory will replace the level two copy with a victim writeback at a future time. Thus the level two memory need not store write a copy. This limits the number of DMA writes to level two directly addressable memory and thus improves performance and minimizes dynamic power. This also frees the level two memory for other master/requestors.

4 Claims, 6 Drawing Sheets

(56) References Cited

U.S. PATENT DOCUMENTS

| | | | |
|---|---|---|---|
| 6,073,212 A * | 6/2000 | Hayes et al. | 711/122 |
| 6,122,711 A * | 9/2000 | Mackenthun et al. | 711/135 |
| 6,314,500 B1 * | 11/2001 | Rose | 711/148 |
| 6,606,686 B1 * | 8/2003 | Agarwala et al. | 711/129 |
| 2002/0010836 A1 * | 1/2002 | Barroso et al. | 711/122 |
| 2002/0129208 A1 * | 9/2002 | Barroso et al. | 711/141 |
| 2003/0023814 A1 * | 1/2003 | Barroso et al. | 711/122 |
| 2009/0037664 A1 * | 2/2009 | Kornegay et al. | 711/138 |

* cited by examiner

| 31 ○○ 29 | 28 | 27 ○○○ 23 | 22 ○○○ 18 | 17 ○○○ 13 | 12 ○○○ 2 | 1 | 0 |
|---|---|---|---|---|---|---|---|
| creg | z | dst | src2 | scr1/cst | opcode | s | p |

PERFORMANCE AND POWER IMPROVEMENT ON DMA WRITES TO LEVEL TWO COMBINED CACHE/SRAM THAT IS CAUSED IN LEVEL ONE DATA CACHE AND LINE IS VALID AND DIRTY

TECHNICAL FIELD OF THE INVENTION

The technical field of this invention is cache for digital data processors.

BACKGROUND OF THE INVENTION

Texas Instruments TMS320C6000 family of digital signal processors employ a two-level memory subsystem. The level one memories include cache and the level two memory contains directly addressable memory, cache or both. The level two directly addressable memory can be cached within level one. Direct memory access (DMA) data transfers access the directly addressable memory at level two. Keeping central processing unit (CPU) versus DMA access to level two memory coherent is important to the programmability of the device. Making this efficient is important to the performance of the device.

SUMMARY OF THE INVENTION

This invention optimizes DMA writes to directly addressable level two memory that is cached in level one and the line is valid and dirty. When the level two controller detects that a line is valid and dirty in level one, the level two memory need not update its copy of the data. Level one memory will replace the level two copy with a victim writeback at a future time. Thus the level two memory need not store write a copy. This limits the number of DMA writes to level two directly addressable memory and thus improves performance and minimizes dynamic power. This also frees the level two memory for other master/requestors.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
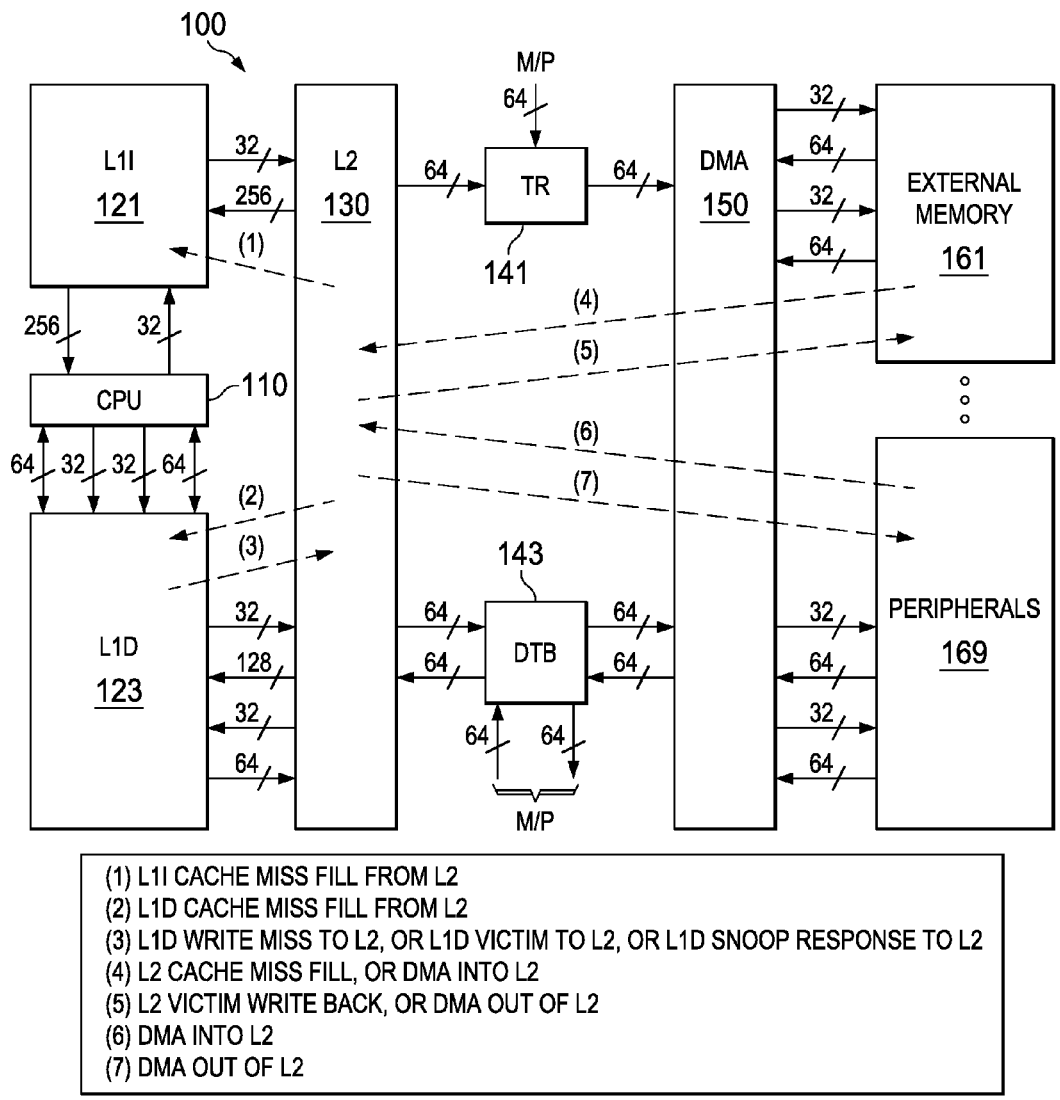
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
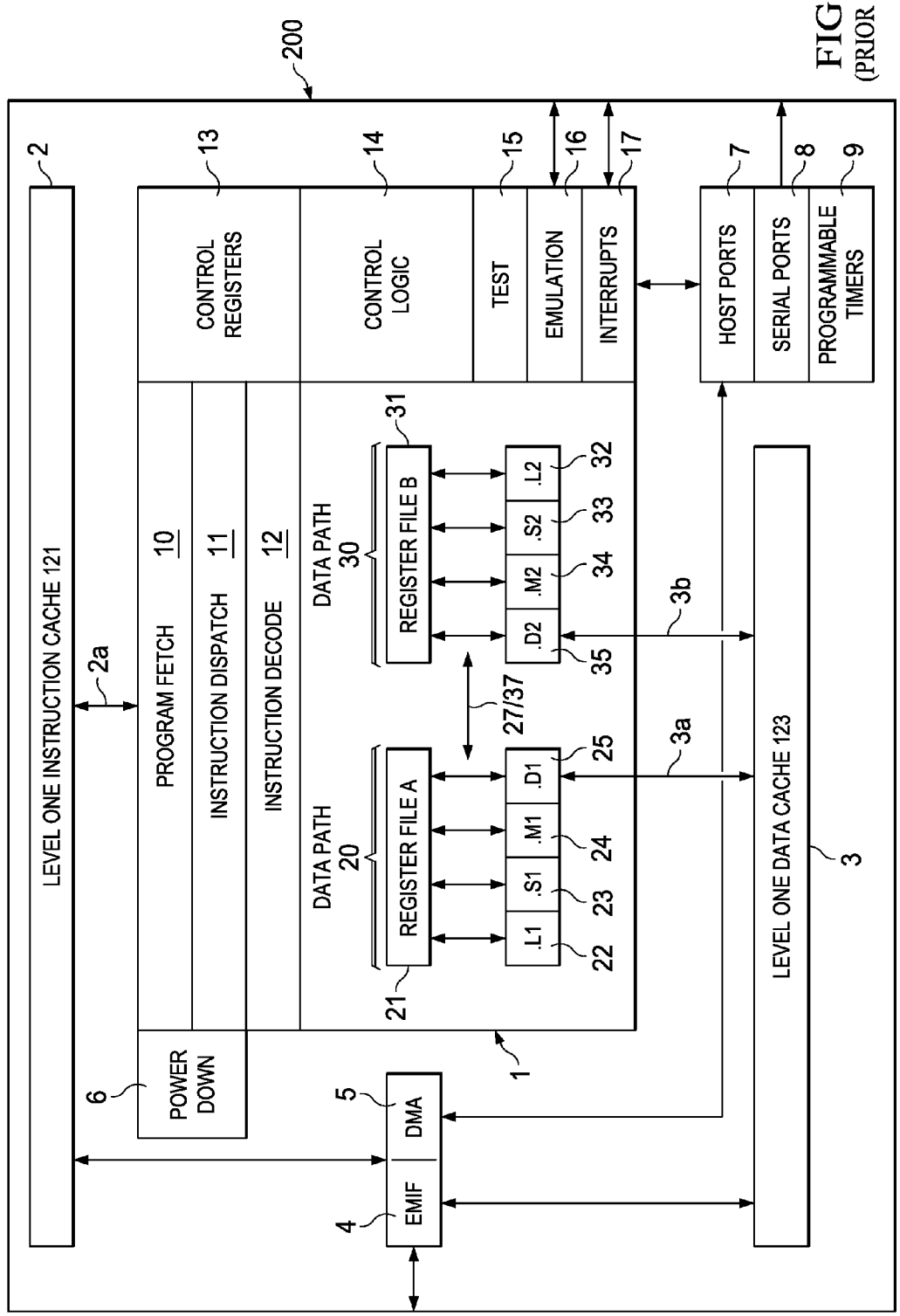
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
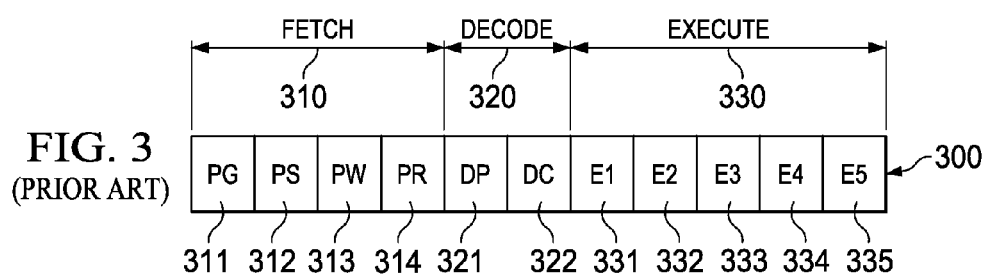
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figures 4, 5:
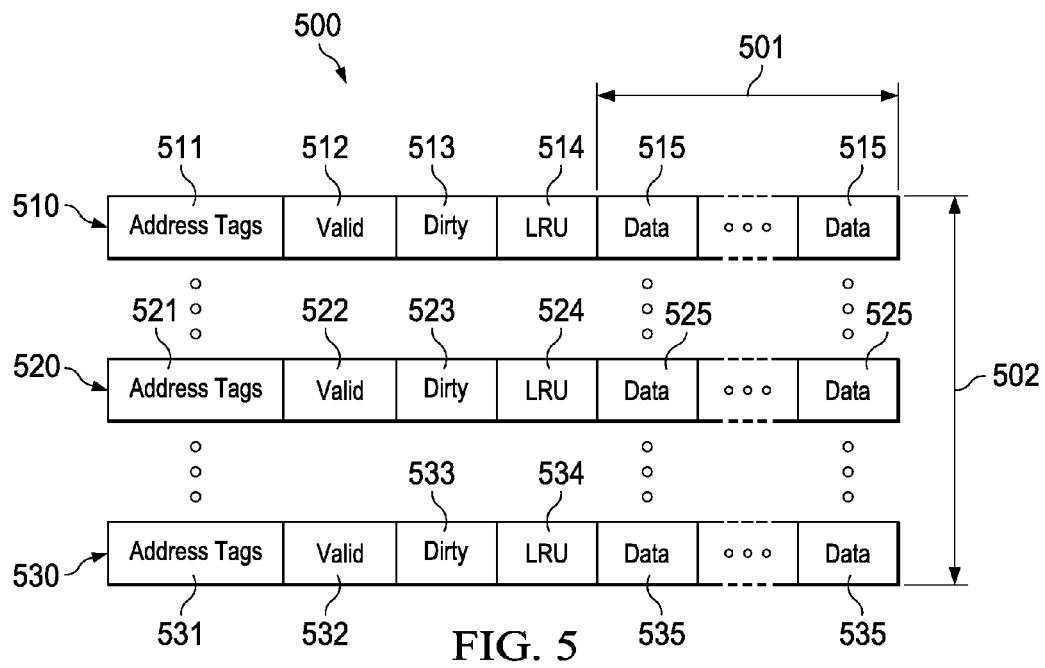
FIG. 4 illustrates the instruction syntax of the very long instruction word digital signal processor core illustrated in FIG. 2 (prior art)
FIG. 5 illustrates the details of a set of typical prior art cache lines (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 illustrates the details of plural cache lines such as used in L1I cache 121, L1D cache 123 and L2 cache 130 illustrated in FIG. 1. Cache 500 illustrated in FIG. 5 includes cache lines 510, 520 and 520 are representative of the internal structure of cache 500. Each of cache lines 510, 520 and 530 includes: respective address tags 511, 521 and 522; respective valid bits 512, 522 and 523; respective dirty bits 513, 523 and 533; respective least recently used (LRU) indicators 514, 524 and 534; and respective data words 515, 525 and 535. Each cache line 510, 520 and 530 includes plural respective data words 515, 525 and 535. The bit length of data words 515, 525 and 535 is set by the minimal addressable data amount of CPU 110. This is typically 8 bits/1 byte.

Cache 500 stores data from more distant memories such as external memory 161 which are accessed by a multi-bit address. Cache 500 is organized to facilitate this storage and to facilitate finding such data in the cache. Each cache line 510, 520 and 530 typically stores $2^N$ respective data words 515, 525 and 535, when N is an integer. The position of data words 515, 525 and 535 within the corresponding cache line 510, 520 and 530 along the dimension 501 serves as a proxy for the least significant bits of the address.

The position of cached data within lines along dimension 502 serves as a proxy for the next most significant bits of the address. The corresponding address tags 511, 521 and 531 form the remainder of the data word address. To determine if a memory access is to data cached within cache 500 (a cache hit), cache 500 compares the address tags for all cache lines to the most significant bits of the memory location accessed. Upon a detecting a match, the position within the cache line along dimension 501 corresponds to the least significant bits of the address permitting identification of the data word accessed.

Each cache line 510, 520 and 530 includes a corresponding valid bit 512, 522 and 532. A first state of this valid bit indicates the corresponding data words 515, 525 or 535 are valid. An opposite state of this valid bit indicates the corresponding data words 515, 525 or 535 are not valid. There are several instances where data stored within cache 500 would not be valid. Upon initial activation of digital signal processor system 100 the L1I cache 121, L1D 123 cache and L2 cache 130 would not be loaded. Thus they would not store valid data. Accordingly, all cache lines are initially marked invalid. During a cache access a match of a requested address with address tags 511, 521 or 531 would not detect a match unless the corresponding valid bit 512, 522 or 532 indicated the data was valid.

Each cache line 510, 520 and 530 includes a corresponding dirty bit 513, 523 and 533. A first state of this valid bit indicates the corresponding data words 515, 525 or 535 are dirty. An opposite state of this valid bit indicates the corresponding data words 515, 525 or 535 are not dirty (clean). Cache memory is generally used for both read accesses and write accesses. Upon a cache hit for a write access, the write data is written into the corresponding location within cache 500. According to the preferred writeback technique, this write data is not immediately forwarded to external memory 161. Instead the respective dirty bit 513, 523 or 533 is set to indicate dirty. A dirty indication means that there has been a write to the cached data not currently reflected in the base memory. According to the writeback technique this data is written to the base memory with the expectation that this writeback can accumulate plural writes to the memory location and nearby memory locations within the same cache line to reduce traffic on the bus to external memory 131.

The least recently used (LRU) bits 514, 524 and 534 are used when a cache line is replaced. Because the cache cannot hold all the data stored in the large, slow memory, the data within the cache must be replaced with new data regularly. Using a data words location within dimensions 501 and 502 as proxy for the least significant bits introduces a problem in locating data within cache 500. If there is only a single cache line having the same location on dimensions 501 and 502, then plural data from the large, slow memory will alias to the same cache line in cache 500. This is data having the same least significant address bits corresponding to dimensions 501 and 502 but differing most significant address bits. An access to such aliased data would require the previous data at that cache line to be replaced. This is considered disadvantageous. A typical prior art cache is set associative. Thus a set of cache lines have the same location on dimensions 501 and 502. Typical sets include two members (two-way set associative) or four members (four-way set associative). Each cache line of such a set is called a way. A cache miss to an address that aliases to one of these sets needs only to evict one of these ways. Determination of which way to evict is typically made based on prior usage of these ways. According to both the temporal and spatial locality principles more recently used cache ways are more likely to be reused than less recently used cache ways. LRU bits 514, 524 and 534 track accesses to cache ways within the set. When data is to be replaced the LRU bits indicate the least recently used way for replacement. Maintaining cache coherence requires writeback of a dirty way upon such replacement.

Figure 6:
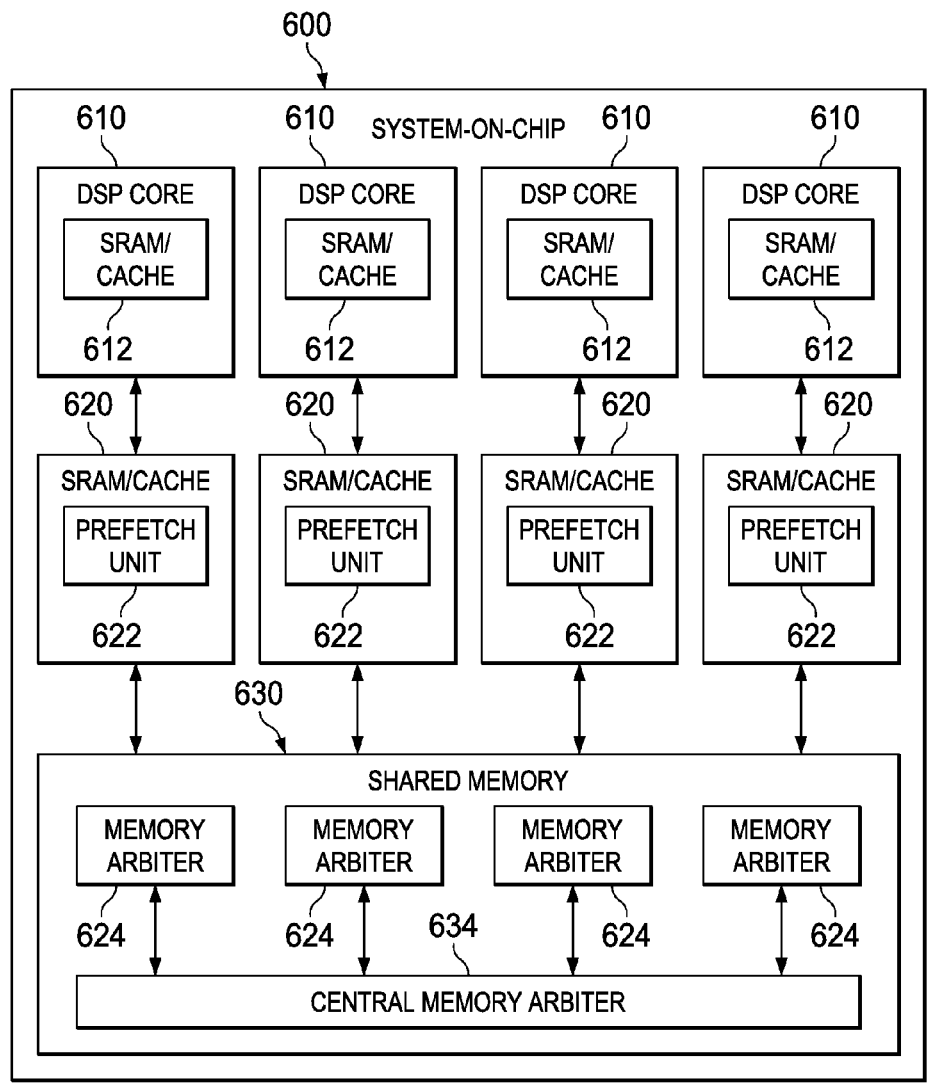
FIG. 6 illustrates a computing system including a local memory arbiter according to an embodiment of the invention.

FIG. 6 is a block diagram illustrating a computing system including a local memory arbiter according to an embodiment of the invention. FIG. 6 illustrates system on a chip (SoC) 600. SoC 600 includes one or more DSP cores 610, SRAM/Caches 620 and shared memory 630. SoC 600 is preferably formed on a common semiconductor substrate. These elements can also be implemented in separate substrates, circuit boards and packages. For example shared memory 630 could be implemented in a separate semiconductor substrate. FIG. 6 illustrates four DSP cores 610, but SoC 600 may include fewer or more DSP cores 610.

Each DSP core 610 preferably includes a level one data cache such as L1 SRAM/cache 612. In the preferred embodiment each L1 SRAM/cache 612 may be configured with selected amounts of memory directly accessible by the corresponding DSP core 610 (SRAM) and data cache. Each DSP core 610 has a corresponding level two combined cache L2 SRAM/cache 620. As with L1 SRAM/cache 612, each L2 SRAM/cache 620 is preferably configurable with selected amounts of directly accessible memory (SRAM) and data cache. Each L2 SRAM/cache 620 includes a prefetch unit 622. Each prefetch unit 622 prefetches data for the corresponding L2 SRAM/cache 620 based upon anticipating the needs of the corresponding DSP core 610. Each DSP core 610 is further coupled to shared memory 630. Shared memory 630 is usually slower and typically less expensive memory than L2 SRAM/cache 620 or L1 SRAM/cache 612. Shared memory 630 typically stores program and data information shared between the DSP cores 610.

In various embodiments, each DSP core 610 includes a corresponding local memory arbiter 624 for reordering memory commands in accordance with a set of reordering rules. Each local memory arbiter 624 arbitrates and schedules memory requests from differing streams at a local level before sending the memory requests to central memory arbiter 634. A local memory arbiter 624 may arbitrate between more than one DSP core 610. Central memory arbiter 634 controls memory accesses for shared memory 630 that are generated by differing DSP cores 610 that do not share a common local memory arbiter 624.

Figure 7:
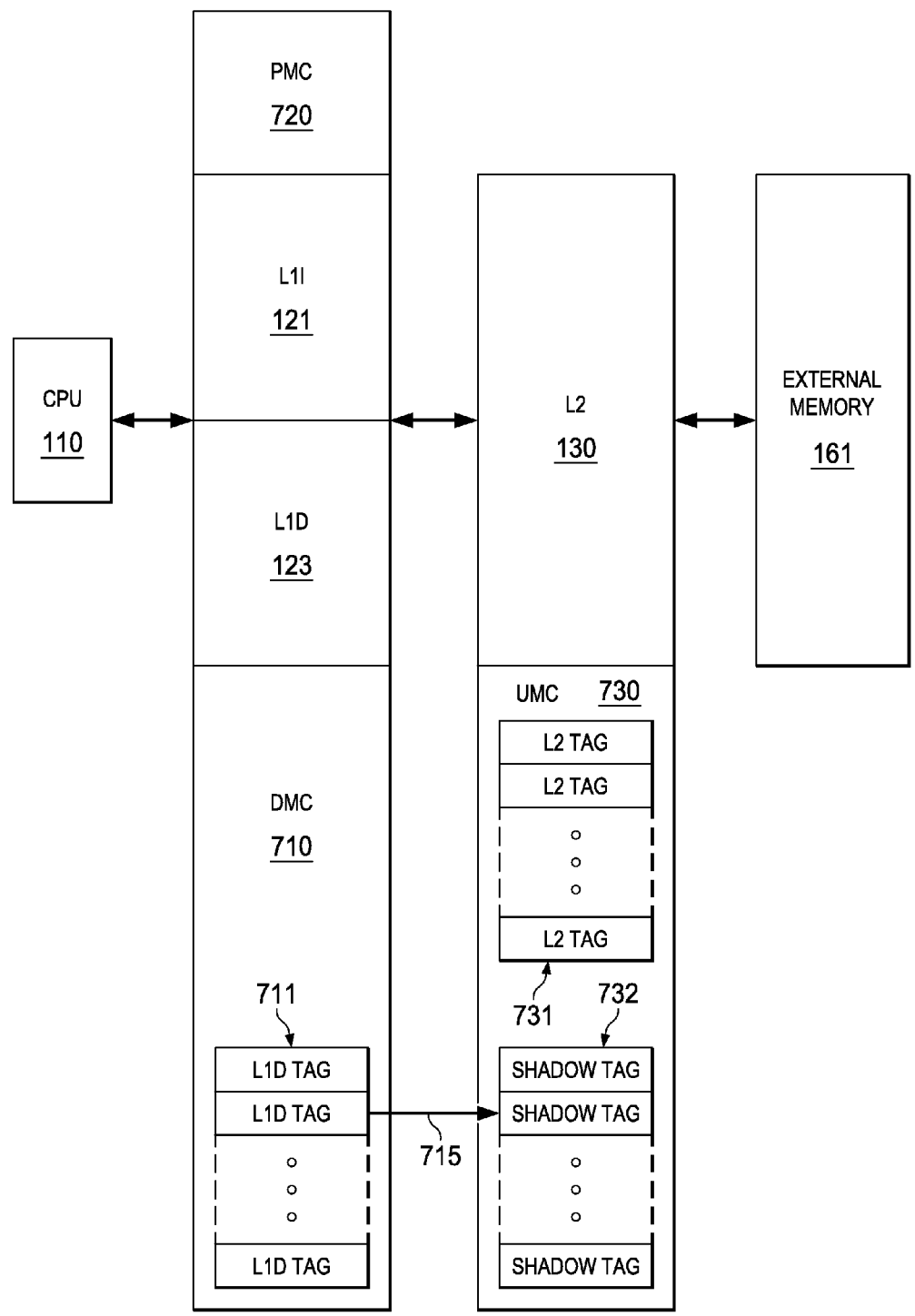
FIG. 7 is a further view of the digital signal processor system of this invention illustrating the various cache controllers.

FIG. 7 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 are controlled by data memory controller (DMC) 710. Data transfers into and out of L1I cache 121 are controlled by program memory controller (PMC) 720. Data transfers into and out of L2 130 including both cache and directly addressable memory (SRAM) are controlled by unified memory controller (UMC) 730. This application is primarily concerned with level 2 cache and UMC 730.

FIG. 7 illustrates further details of DMC 710 and UMC 730. DMC 710 includes L1D cache tags 711. These tags are the non-data part of cache lines 510, 520 and 530 illustrated in FIG. 5 for L1D cache 123. UMC 730 includes two sets of cache tags. The first set of cache tags are L2 tags 731. These are non-data part of cache lines 510, 520 and 530 illustrated in FIG. 5 for L2 cache 130. The second set of cache tags are shadow tags 732. As shown by bus 715 shadow tags 732 generally correspond to L1D cache tags 711 except these are located in UMC 730. Shadow tags 732 include at least the valid and dirty status of the corresponding cache lines in L1D cache 123.

UMC 730 uses shadow tags 732 to implement snoop read and write coherence. UMC 730 tracks the status of L1D cache lines. Shadow tags 732 are used only for snoops intending to keep L2 SRAM coherent with the level one data cache. Thus updates for all external cache lines are ignored. Shadow tags 732 are updated on all L1D cache allocates and all dirty and invalidate modifications to data stored in L2 SRAM. These interactions happen on different interfaces, but the traffic on that interface includes level one data cache accesses to both external and level two directly addressable lines. These interactions create extra traffic on these interfaces and creating extra stalls to the CPU. Thus in this invention shadow tags 732 are updated only on a subset of less than all updates of the level one tags 711.

These tag updates are pipelined out from DMC 710 to UMC 730. Command ordering requirements require DMC 710 to ensure that all tags update prior to a particular command have been send out to shadow tags 732. L1D cache 123 and CPU 110 stall until that is complete. The performance improvement from this invention is a result of having to do this very few times. Additional improvements come from reduced dynamic power consumption as a result of largely reduced accesses to the shadow tags 732.

Shadow tags 732 tracks what addresses L1D cache 123 holds and whether the lines associated with those addresses are clean or dirty. UMC 730 queries shadow tags 732 whenever an outside DMA request reads or writes L2 SRAM.

On DMA reads, UMC 730 snoops L1D cache 123 (sends a request to L1D) if it detects that the DMA access is to an address held in L1D cache 123 and the corresponding L1D cache line is valid and dirty.

On DMA writes, UMC 730 snoops L1D cache 123 if it detects L1D cache 123 holds a copy of the address and the corresponding L1D cache line is valid and clean. In addition, the DMA write address is also sent to the L2 SRAM to maintain coherency between L1D and L2 SRAM.

Figure 8:
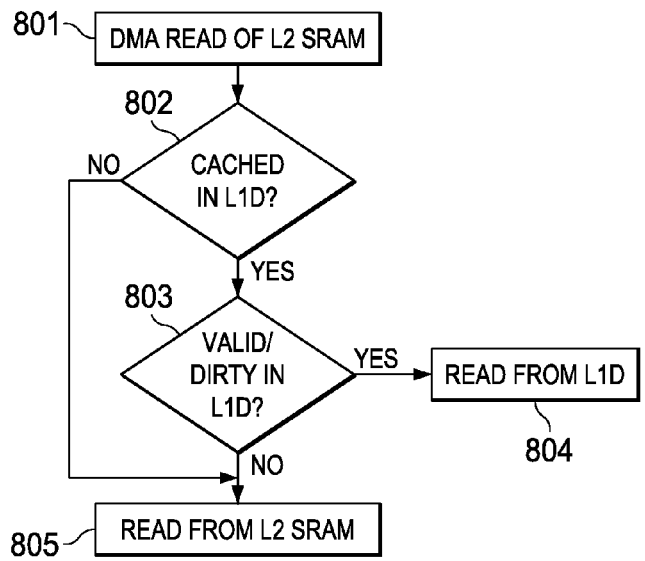
FIG. 8 is a flow chart illustrating the operations upon a DMA read from the level two directly addressable memory.

FIG. 8 illustrates operations on a DMA read from L2 SRAM (block 801). Test block 802 determines whether the data to be read from L2 SRAM is cached in L1D cache 123. This is determined in UMC 730 by referral to shadow tags 732. If this is the case (Yes at test block 802), then test block 803 determines if the data is valid and dirty in L1D cache 123. This is determined in UMC 730 by referral to shadow tags 732. If this is the case (Yes in test block 803), then the read takes place from L1D cache 123. This read takes place from L1D cache 123 because L1D cache 123 holds the only valid copy of the data. This read may take place by direct communication with L1D cache 123. An additional option is forcing L1D cache 123 to writeback this data. Following the writeback the data in L2 SRAM is correct and the read can be made from L2 SRAM.

If the DMA read data is not cached in L1D cache 123 (No at test block 802) or if it is cache in L1D cache 123 and not valid and dirty (No at test block 803), then the read takes place from L2 SRAM. If the data is not cached in L1D cache 123, then L2 SRAM holds the only copy. If the data is cached in L1D cache 123 and that entry is invalid, then L2 SRAM holds the only valid copy. In both these cases the data must be read from L2 SRAM. If the data is cached in L1D cache 123 and that entry is clean, then L1D cache 123 and L2 SRAM hold the same valid data. Thus the DMA read can take place from L2 SRAM without resort to L1D cache 123.

Figure 9:
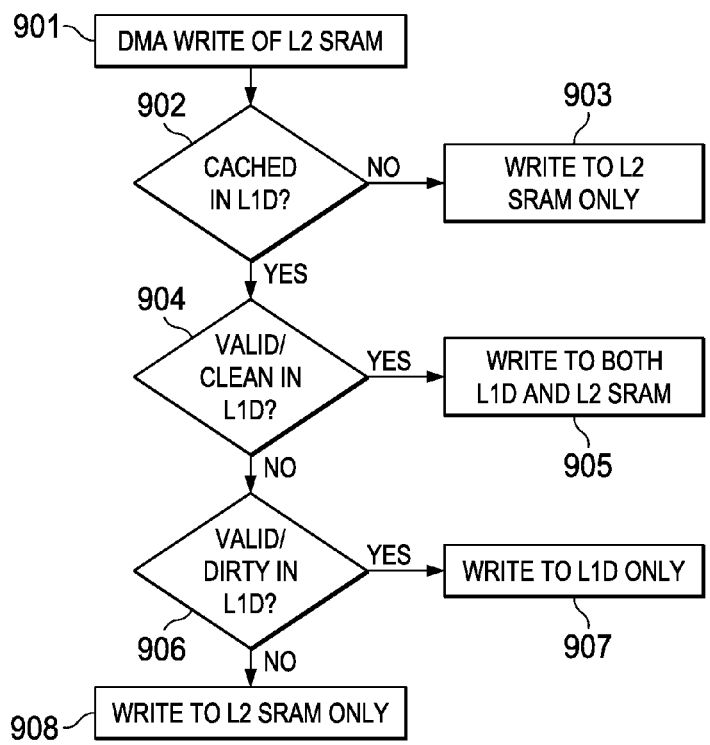
FIG. 9 is a flow chart illustrating the operations upon a DMA write to the level two directly addressable memory.

FIG. 9 illustrates operations on a DMA write to L2 SRAM (block 901). Test block 902 determines whether the write data is cached in L1D 123. If this is not the case (No at test block 902), then the DMA write occurs only in L2 SRAM (block 903). If this is the case (Yet at test block 903), then test block 904 determines if the write data is valid and clean in L1D 123. If this is the case (Yes at test block 904), then the DMA write occurs in both L1D 123 and L2 SRAM (block 905). If this is not the case (No at test block 904), then test block 906 determines if the write data is valid and dirty in L1D 123. If this is the case (Yes at test block 906), then the DMA write occurs in L1D 123 only (block 907). If this is not the case (No at test block 906), them the DMA write occurs n L2 SRAM only (block 908).

This invention optimizes performance and power on DMA writes to L2 SRAM that are cached in L1D line, and are valid and dirty (Yes at test block 906). On such writes, the L2 controller only sends snoop writes to L1D (block 907) if it detects L1D holds a copy of the address and the corresponding L1D cache line is valid and dirty (Yes at test block 906). It does not send an extra write to the L2 SRAM memory. This reduces the number of writes to L2 SRAM and reduces dynamic power in the system.

Previous generations of C6000's Two-Level Memory Hierarchy maintained coherence between L1D and L2 on DMA write activity by performing both a write to L2 SRAM and sending a snoop write to L1D when the corresponding line is cached in L1D cache 123 and is valid and dirty.

This invention optimizes all DMA writes that are cached in L1D cache 123 and line is valid and dirty. In such cases, a snoop to the L1D line is sent only and a write to the L2 SRAM is not performed. Coherency is maintained since the dirty line in L1D would be eventually written back to L2 SRAM when it is replaced and evicted. This optimizes performance and reduces power.

This solution improves system performance by not sending extra DMA writes to L2 SRAM and thus frees it up for other requestors. In addition, it would prevent unnecessary stalls in the DMA pipeline when the L2 SRAM banks are busy servicing another requestor. Dynamic power improvement is also realized with this solution.

What is claimed is:

1. A data processing system comprising:
a central processing unit for executing instructions manipulating data;
a first level cache connected to said central processing unit temporarily storing in a plurality of cache lines data for manipulation by said central processing unit, each cache line including a tag indicating a valid and a dirty status of said data stored therein;
a second level memory connected to said first level cache including second level cache memory temporarily storing in a plurality of cache lines data for manipulation by said central processing unit and second level directly addressable memory, wherein said first level cache may cache data stored in said second level directly addressable memory;
a direct memory access unit connected to said central processing unit, said second level memory and an external memory, said direct memory access unit operating under control of said central processing unit to control data transfers including transferring data into said second level directly addressable memory; and
a second level memory controller having a set of shadow tags corresponding to said tags of said first level cache, said second level memory controller operable upon a direct memory access unit data transfer into said second level directly addressable memory to
determine from said shadow tags if the address of said data transfer into said second level directly addressable memory is cached in said first level cache,
if said address of said data transfer into said second level directly addressable memory is cached in said first level cache, determine from said shadow tags if said data is valid and dirty in said first level cache, and
if said address of said data transfer into said second level directly addressable memory is cached in said first level cache as valid and dirty, then transferring said data into a corresponding cache line in said first level cache and not into said second level directly addressable memory.

2. The data processing system of claim 1, wherein:
said second level memory controller is further operable to
if said address of said data transfer into said second level directly addressable memory is not cached in said first level cache, transferring said data into said second level directly addressable memory.

3. The data processing system of claim 1, wherein:
said second level memory controller is further operable to
if said address of said data transfer into said second level directly addressable memory is cached in said first level cache as valid and clean, then transferring said data both into a corresponding cache line in said first level cache and into said second level directly addressable memory.

4. The data processing system of claim 1, wherein:
said second level memory controller is further operable to
if said address of said data transfer into said second level directly addressable memory is cached in said first level cache as invalid, then transferring said data into said second level directly addressable memory and not into a corresponding cache line in said first level cache.

* * * * *